United States Patent
Tan et al.

[11] Patent Number: 5,892,784
[45] Date of Patent: Apr. 6, 1999

[54] N-DRIVE P-COMMON SURFACE EMITTING LASER FABRICATED ON N+ SUBSTRATE

[75] Inventors: Michael R. T. Tan, Menlo Park; Albert T. Yuen, Cupertino; Shih-Yuan Wang, Palo Alto, all of Calif.

[73] Assignee: Hewlett-Packard Company, Palo Alto, Calif.

[21] Appl. No.: 330,033

[22] Filed: Oct. 27, 1994

[51] Int. Cl.$^6$ .................................................. H01S 3/19
[52] U.S. Cl. .............................. 372/43; 372/96; 372/50; 372/45
[58] Field of Search ................................ 372/43, 44, 96, 372/45, 50; 257/12; 437/129

[56] References Cited

U.S. PATENT DOCUMENTS

| | | | |
|---|---|---|---|
| 5,009,719 | 4/1991 | Yoshida | 257/12 |
| 5,146,465 | 9/1992 | Khan et al. | 372/43 |
| 5,212,706 | 5/1993 | Jain | 372/50 |
| 5,363,393 | 11/1994 | Uomi et al. | 372/96 |
| 5,416,044 | 5/1995 | Chino et al. | 437/129 |

FOREIGN PATENT DOCUMENTS

| | | |
|---|---|---|
| 0 580 104 A3 | 1/1994 | European Pat. Off. . |
| 62-291192 | 12/1987 | Japan . |

OTHER PUBLICATIONS

Hadley, M. A., et al., "High Single–Transverse–Mode Output from External–Cavity Surface–Emitting Laser Diodes", Applied Physics Letters, vol. 63, No. 12, Sep. 20, 1993, pp. 1607–1609.

Wipiejewski T., et al., "Characterization of Two–Sided Output Vertical–Cavity Laser Diodes by External Optical Feedback Modulation", IEEE Lasers and Electro–Optoics Society, Nov. 15–18, 1993, pp. 564–565.

*Primary Examiner*—Rodney B. Bovernick
*Assistant Examiner*—Yisun Song

[57] ABSTRACT

The present invention provides a n-drive surface emitting laser comprised of an active region, a first mirror region having a first conductivity type, a second mirror region having a second opposite conductivity type, the first and second mirror regions being located on opposite sides of the light generation region, a buffer region having a second conductivity type, and a substrate having a first conductivity type. In the preferred embodiment the first conductivity type is n-type, thus the present invention provides a method of forming an n-drive semiconductor laser on an n-type substrate. Contact is made to the p-type mirror region via a tunnel junction formed by degeneratively doping the areas of the substrate region and the buffer region which abut each other. The tunnel junction is reverse biased so that current is injected through the degeneratively doped p-n junction formed by the n+ substrate and the p-type conducting layer.

16 Claims, 7 Drawing Sheets

N-DRIVE P-COMMON SURFACE EMITTING LASER FABRICATED ON N+ SUBSTRATE

BACKGROUND OF THE INVENTION

The present invention relates generally to surface emitting lasers and more specifically to formation of an n-drive p-common laser fabricated on an n-type substrate.

Originally semiconductor lasers were diode structures where the light emitted from the edge of the laser structure was parallel to the surface of the semiconductor wafer. Unfortunately, this edge emitting laser structure does not lend itself to the cost-effective fabrication of two-dimensional arrays of laser diodes. A second class of laser diodes, well suited for fabrication of laser arrays, is fabricated such that the laser structure is perpendicular to the surface of the semiconductor wafer so that the emitted light is perpendicular to the surface. These laser diodes are commonly known as surface emitting lasers (SELs).

Both classes of lasers are formed on a starting substrate which may be either semi-insulating, p-type or n-type. Referring to FIG. 1A shows a cross-sectional view of a conventional n-drive SEL 100 formed on a semi-insulating substrate 102. The surface emitting laser 100 may be viewed as a n-i-p diode comprised of an n-type mirror region 104, an active region 106, and a p-type mirror region 108. Electrical connection is made via electrode 110 formed on the top surface of the n-type mirror region 104 and electrode 112 formed on the p-type mirror region 108.

To make electrical contact to the p-type region 108, an etch is made through both the n-type mirror region 104 and the active region 106 to the p-type region 108. This is problematic since the p-type contact etch exposes epitaxial layers 104, 106, 108 which have a tendency to oxidize. Further, the p-type contact etch creates a non-planar structure creating device reliability problems and increasing manufacturing complexity. Further, defects added to semi-insulating substrates to make the substrate isolating reduce the reliability of the semiconductor laser device.

Referring to Figure 1B, shows a cross-sectional view of a conventional n-drive surface emitting laser 120 formed on a p-type substrate 122. The SEL is comprised of a n-type mirror region 124, an active region 126, and a p-type mirror region 128. Electrical interconnections are made via electrode 130 formed on the surface of the n-type mirror region 124 and electrode 132 formed on the surface of the p-type substrate 122. The preferred method of formation for the n, i, and p-type regions is by molecular beam epitaxy. The only commonly available p-type substrate is zinc doped. However, at typical MBE growth temperatures, zinc outdiffuses causing unacceptable background concentration in the mirror regions 124, 128 and the active region 126. Further, zinc outdiffusion contaminates the molecular beam epitaxy chamber resulting in an additional cleaning step after each zinc contamination.

FIG. 1C shows a cross-sectional view of a surface emitting laser 140 formed on an n-type substrate 142. The SEL is comprised of a n-type mirror region 144, an active region 146, and a p-type mirror region 148. The SEL 140 shown in FIG. 1C is a p-drive SEL. Unlike the n-drive current driven SELs shown in FIGS. 1A and 1B, the p-drive SEL is typically voltage driven. Although current drivers for p-drive SELs exist, they are problematic. The available silicon pnp drivers typically have insufficient speed for current data rates of optical communication systems and GaAs pnp drivers are expensive.

However, problems are also associated with voltage driven p-drive SELs. Voltage driven p-drive SELs in SEL arrays require precise control so that the Vf of each individual laser in the array is uniform. Nonuniformities in $V_f$ require individually pre-biasing each individual laser in the laser array; thereby increasing the cost of the laser drivers. Of course n-drive SELs may be created from the structure shown in FIG. 1C by sawing between individual lasers and flipping the p-drive SELs. However, this eliminates the possibility of SEL arrays.

A method of forming an array of n-drive semiconductor laser on a n-type substrate is needed.

SUMMARY OF THE INVENTION

The present invention provides a n-drive surface emitting laser comprised of an active region, a first mirror region having a first conductivity type, a second mirror region having a second opposite conductivity type, the first and second mirror regions being located on opposite sides of the active region, a buffer region having a second conductivity type, and a substrate having a first conductivity type. In the preferred embodiment the first conductivity type is n-type. Thus the present invention forms a p-type buffer region between the p-type mirror region and the n substrate allowing the use of an n-type silicon doped substrate. Thus the present invention provides a method of forming an n-drive p-common semiconductor laser on an n-type substrate.

In the preferred embodiment, p contact is made to the p-type mirror region via a tunnel junction. The tunnel junction is formed by degeneratively doping the areas of the substrate region and the buffer region which abut each other. The tunnel junction is reverse biased so that current is injected through the degeneratively doped p-n junction formed by the n+ substrate and the p+ buffer region.

The process of forming the p contact by tunnel junction provides a planar device structure which increases laser device reliability. Compared to the n-drive device formed on a semi-insulating substrate, the present invention eliminates the step of etching through the n-type mirror region and the active region to contact the p-type mirror region. Further, compared to the n-drive device formed on a p-type substrate, the problem of zinc outdiffusion during MBE layer formation is eliminated.

In a second alternative embodiment, a p+ buffer layer is deposited on the n-type substrate and p contact is made either by etching through n-type mirror region, the light generation region and the p-type mirror region to the p-type buffer region or alternatively by etching through the bottom n-type substrate to the p-type buffer region. For a top emitting laser, the solid n-contact may be replaced with a ring contact. For a bottom emitting laser, p contact is made by either etching through the n+ substrate to the p-type buffer region or alternatively by etching through the n-type mirror region, the active region, and the p-type mirror region to the p-type buffer region. A phase matching layer may be added in the n-type mirror of a bottom emitting laser to provide constructive addition of the light reflected from the metal contact terminating the n-mirror.

A further understanding of the nature and advantages of the present invention may be realized with reference to the remaining portions of the specification and the attached drawings.

DESCRIPTION OF THE PREFERRED EMBODIMENTS OF THE INVENTION

Figure 1A:
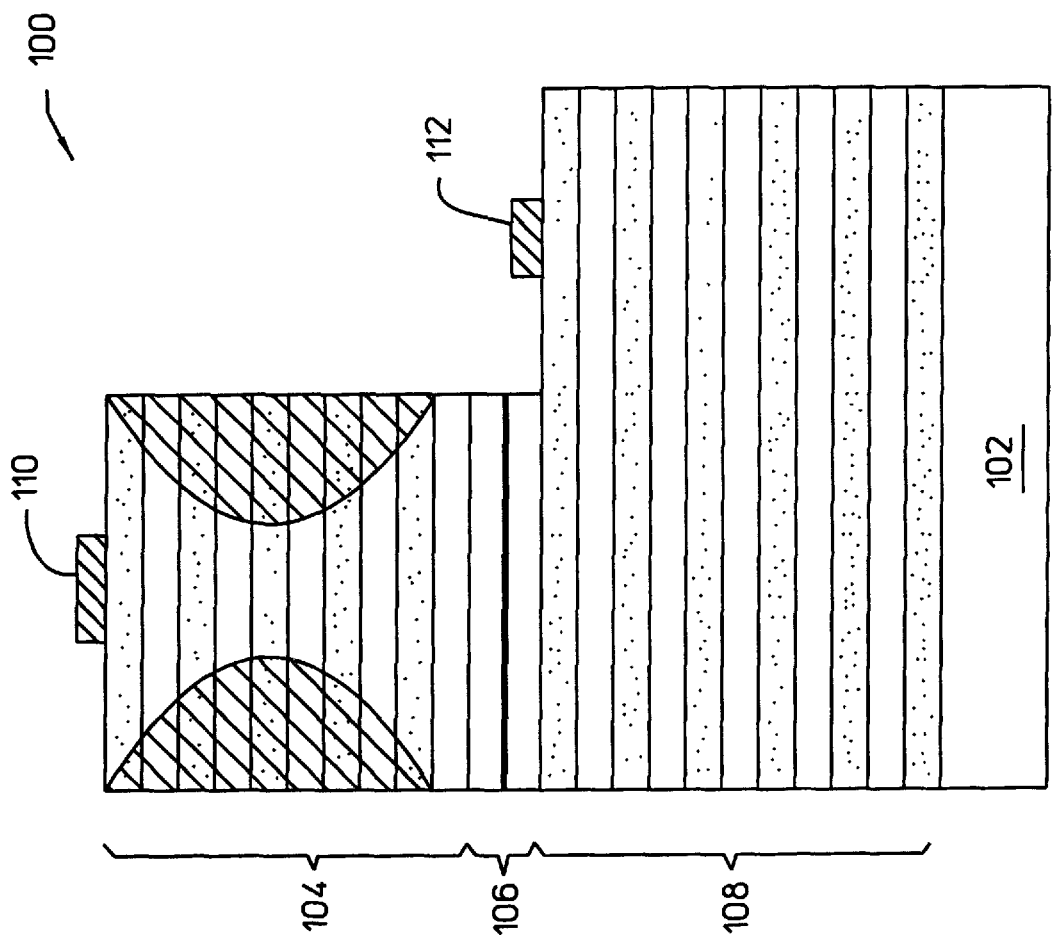
FIG. 1A shows a cross-sectional view of a conventional n-drive surface emitting laser formed on a semi-insulating substrate.
Figure 1B:
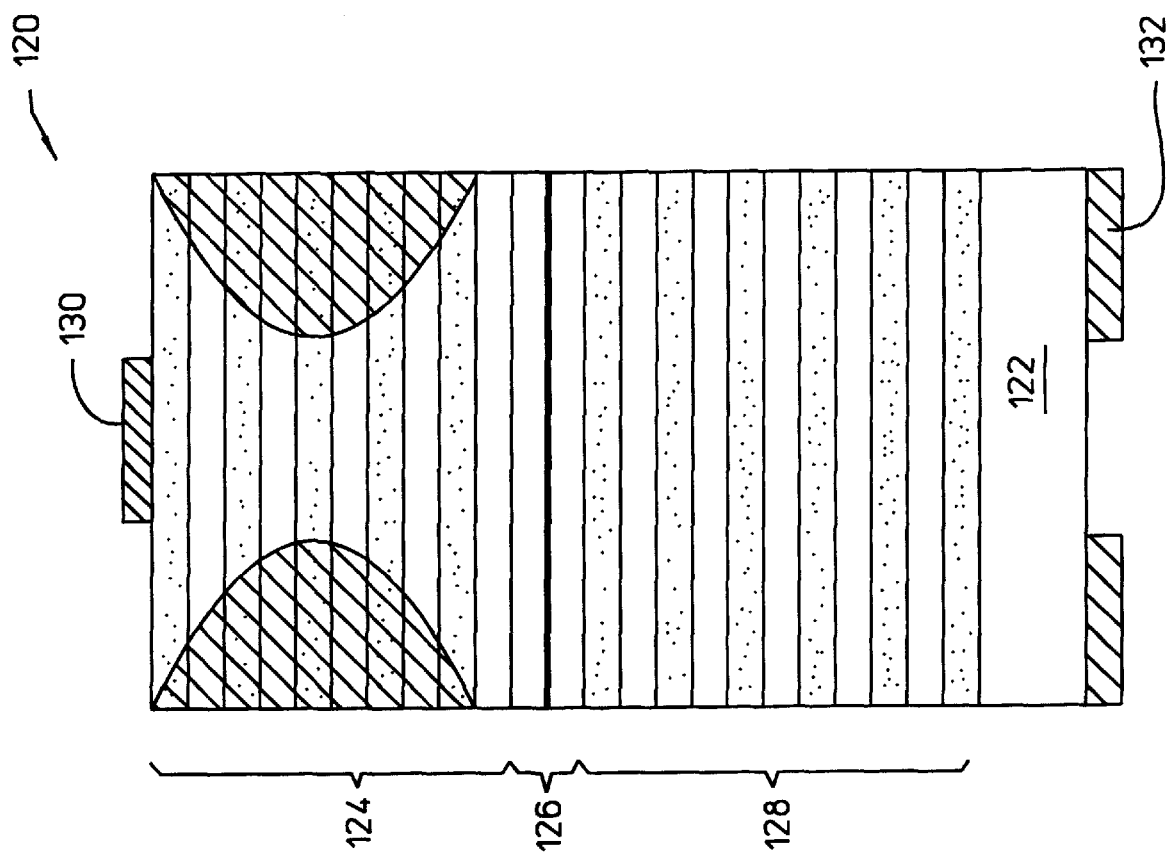
FIG. 1B shows a cross-sectional view of a conventional n-drive surface emitting laser formed on a p-type substrate
Figure 1C:
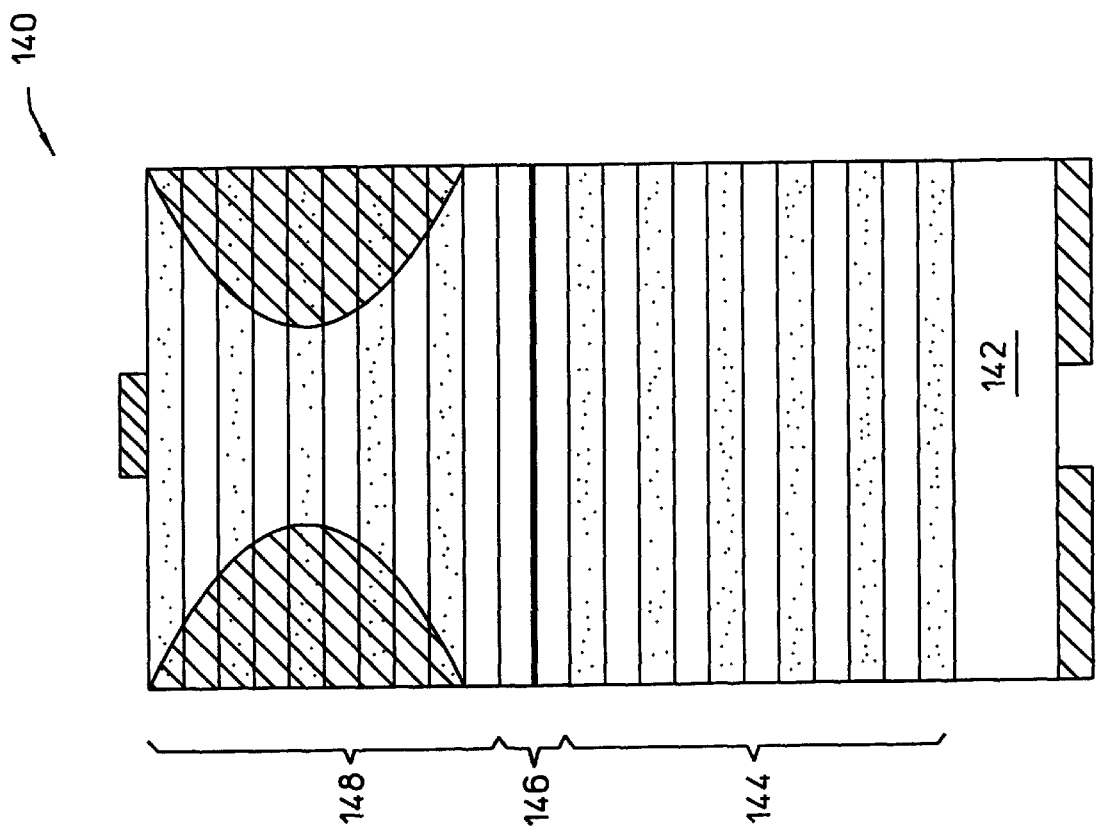
FIG. 1C shows a cross-sectional view of a p-drive surface emitting laser formed on a n-type substrate.
Figure 2A:
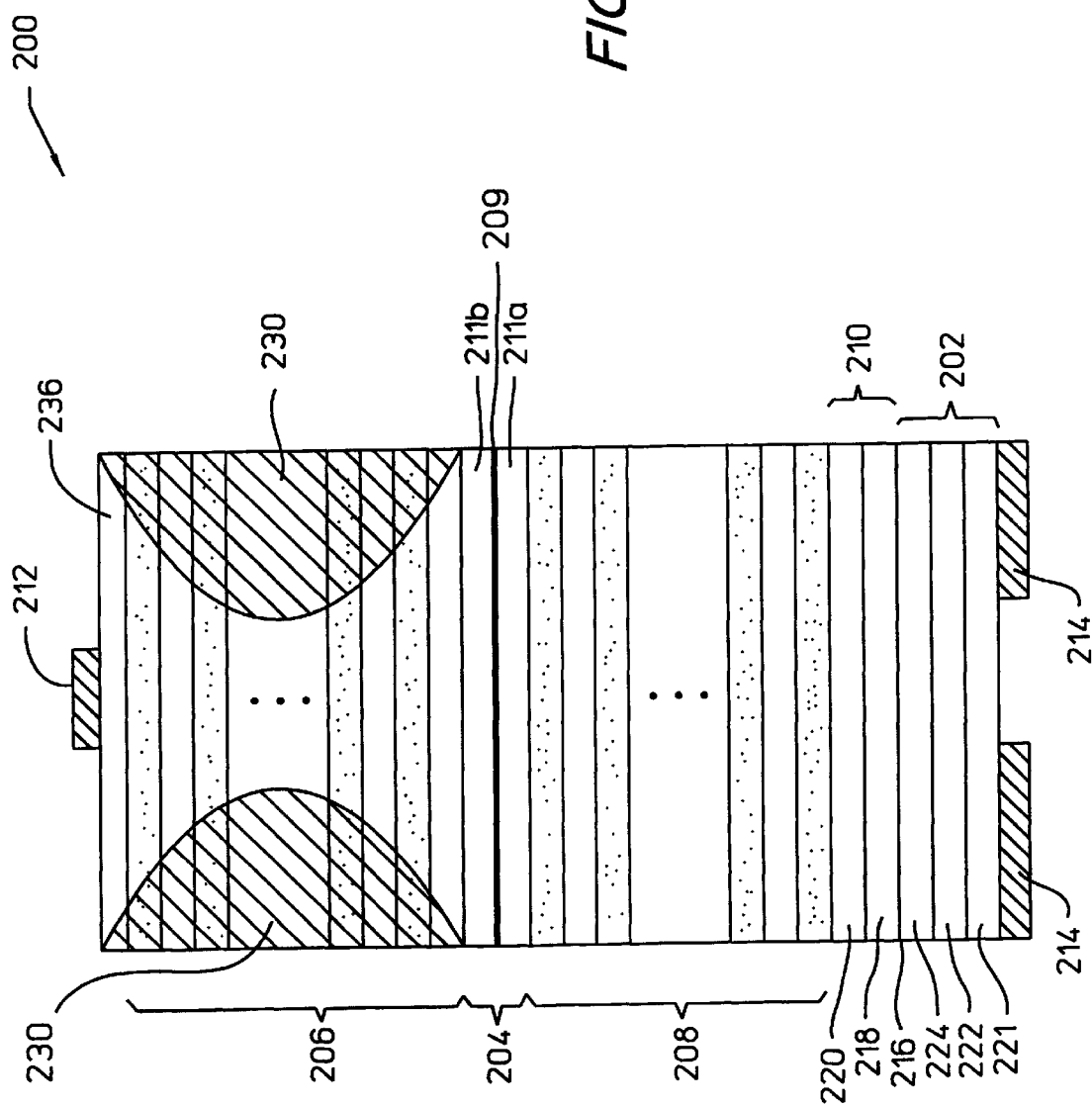
FIGS. 2A and 2B show a cross-sectional view of the n-drive SEL fabricated on a n-type substrate according to the preferred embodiment of the present invention.
Figure 2B:
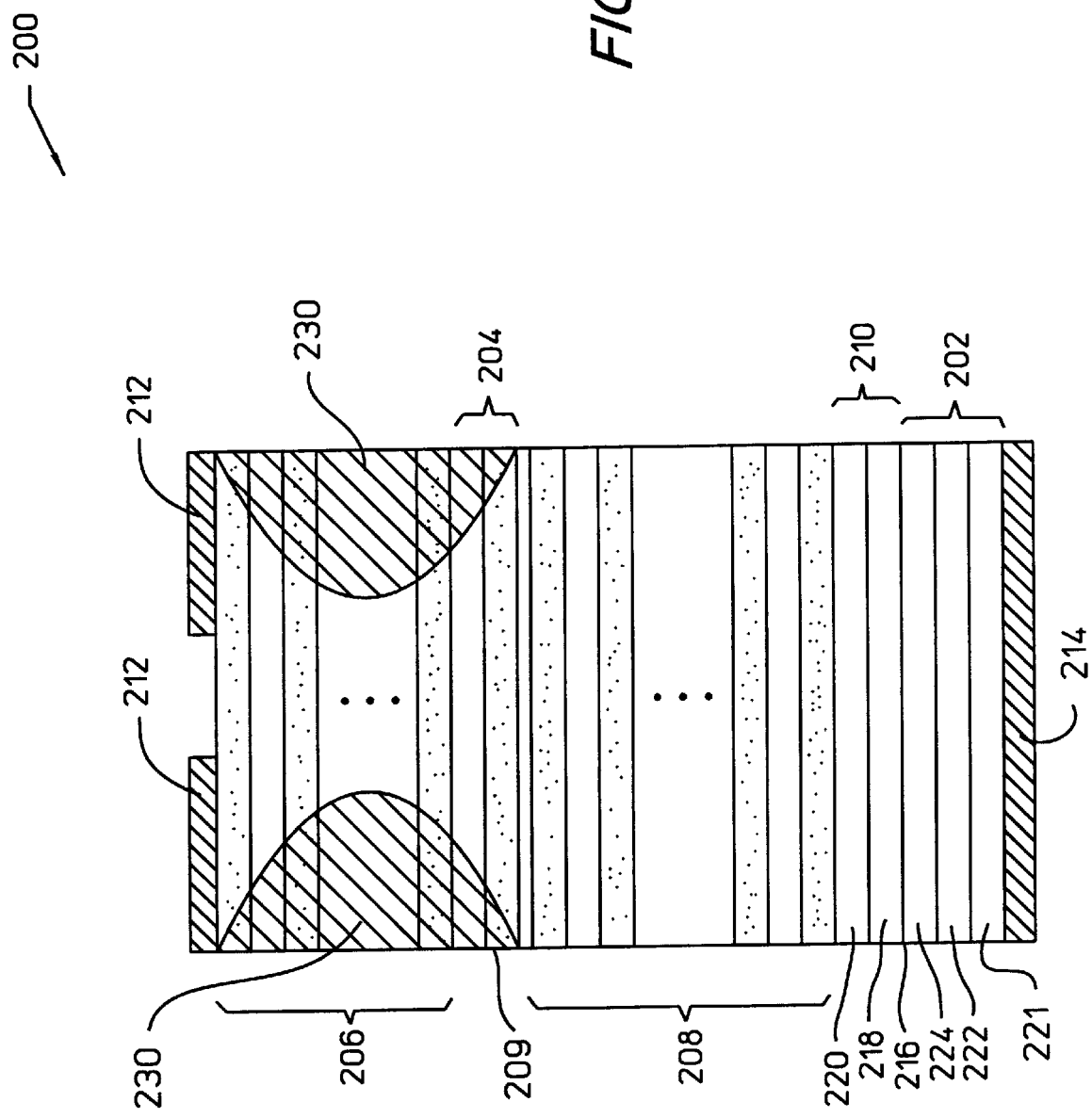

Referring to FIG. 2 shows a cross-sectional view of the n-drive SEL 200 fabricated on a n-type substrate 202 according to the preferred embodiment of the present invention. FIG. 2A shows a bottom emitting n-drive SEL. FIG. 2B shows a top emitting n-drive SEL. The n-drive SEL 200 shown is comprised of an active region 204, first and second mirror regions 206, 208 located on opposite sides of the active region, a buffer region 210, and a substrate 202. For the purposes of discussion, the SEL 200 may be viewed as a n-i-p diode having an n-type mirror region 206, an active region 204, and a p-type mirror region 208.

In the present invention, the substrate 202 and the first mirror region 206 have a first conductivity type. The second mirror region 208 and the buffer region 210 are of a second opposite conductivity type. In the preferred embodiment the first conductivity type is n-type. Thus the preferred embodiment provides a method of forming an n-drive semiconductor laser on an n-type substrate. In the present invention the first and second mirrors 206, 208 both have a first and second side. The active region 204 is located between the first and second mirrors 206, 208 such that the first side of the first mirror region is adjacent to the first side of the active region and the first side of the second mirror is adjacent to the second opposite side of the active region. The buffer region 210 is located between the substrate region and the second mirror region such that the first side of the buffer region is adjacent to the the second side of the second mirror region and the second side of the buffer region is adjacent to the first side of the substrate region.

The first and second mirror regions 206, 208 are constructed from alternating layers having different indices of refraction using techniques well known in the art. The thickness of each layer is chosen to be ¼ of the wavelength of light to be emitted. The alternating layers form Bragg mirrors. The alternating layers are typically constructed of AlAs and GaAs or AlGaAs.

The light generation region 209 of the active region 204 generates light due to spontaneous and stimulated emission via the recombination of electrons and holes generated by forward biasing the n-i-p diode. The light generation region 209 of the light emitting device 200 shown in FIG. 2 is typically constructed of one or more quantum wells of InGaAs, GaAs, AlGaAs, or InAlGaAs which are separated from the first and second mirror regions 206, 208 by cladding regions 211a, 211b. The choice and thickness of the material depends on the desired wavelength of the light emitted by the SEL 200.

Electrical power to the SEL 200 is applied between contacts 212, 214. The junction 216 formed between the buffer region 210 and the substrate 202 forms a tunnel contact. The buffer region 210 is typically comprised of a first layer 220 having a first dopant concentration and a second degeneratively doped layer 218 having a second dopant concentration. The tunnel diode is reversed biased so that application of a voltage to electrode contacts 212, 214 injects current through the degeneratively doped p-n junction 216. Typically, the tunnel diode is reverse biased by applying a negative voltage to contact 212 and coupling contact 214 to ground.

It should be noted that the SEL shown in FIGS. 2 and 3 are not to scale. In particular, the mirror regions 206, 208 and the active region 204 have been expanded to provide clarity in the drawings. In practice, the thickness of the substrate region 202 is approximately 150 $\mu$m as compared to about a 10 $\mu$m combined thickness of the mirror regions 206, 208, the active regions 204, and the buffer region 210. Electrodes 212, 214 are approximately 10 $\mu$m in diameter, while electrode 214 has an opening of approximately 20–150 $\mu$m.

An array of SELs can be constructed by depositing a plurality of layers on the substrate 202. In the preferred embodiment, the layers are deposited by molecular beam epitaxy. In the embodiment shown in FIG. 2 where the p contact is made via a tunnel junction 216, the substrate region 202 is comprised of three layers. The first layer 221, is the GaAs substrate. The GaAs is doped with an n-type dopant, preferably silicon, and has a silicon dopant concentration typically in the range of $5\times10^{17}$ to $5\times10^{19}$ atoms/cm$^3$. The second layer 222 is a GaAs silicon doped n-type layer typically has a dopant concentration in the range of $5\times10^{18}$ to $1\times10^{19}$ atoms/cm$^3$ and a thickness in the range of 100 to 3000 angstroms. The third layer 224 of the substrate region 202 is a degeneratively doped n-type layer typically having a thickness in the range of 100 to 1000 Å and a dopant concentration in the range of approximately $5\times10^{17}$ to $1\times10^{19}$ atoms/cm$^3$.

The buffer region 210 is typically comprised of two layers 218, 220, grown by molecular beam epitaxy having different dopant concentrations. The first layer 218 is a p-type very degeneratively doped GaAs layer typically doped with carbon having a dopant concentration in the range of $1\times10^{19}$ to $1\times10^{21}$ atoms/cm$^3$ and a thickness in the range of 100 to 1000 Å. The preferred dopant concentration is $1\times10^{20}$ atoms/cm$^3$ and the preferred thickness is 200 Å. The second layer 220 of the buffer region 210 is a typically GaAs doped with carbon having a dopant concentration in the range of $5\times10^{17}$ to $1\times10^{20}$ atoms/cm$^3$ and a thickness in the range of 1000 to 5000 Å. The preferred dopant concentration is $5\times10^{19}$ at oms/cm$^3$ and the preferred thickness is 3000 Å.

Although the number of layers and dopant concentrations of the substrate region 202 and the buffer region 212 may vary, the important thing is to have high enough dopant concentration at the junction 216 between n-type substrate region 202 and p-type buffer region 210 to form a tunnel contact so that current may easily flow across the junction 216. For example, the dopant concentration of the first layer 218 of the buffer region is given as in the range of $1\times10^{19}$ to $1\times10^{21}$ atoms/cm$^3$, the dopant concentration may be higher. The $1\times10^{21}$ atoms/cm$^3$ is more a function of what is reasonably attainable by current process technology than limitations required for formation of a tunnel contact.

In addition to the number of layers and dopant concentrations of the substrate region 202 and the buffer region 212 varying, the material used in forming the substrate region 202 and the buffer region may also vary. For example, instead of using GaAs to form all of the layers of the substrate region 202 and the buffer region 210, some of the layers may be comprised of InGaAs or another bandgap material. For example, the substrate region the third layer 224 of the substrate region and the first layer 218 of the buffer region may be degeneratively doped InGaAs. Using InGaAs at the tunnel junction 216 provides a lower tunnel voltage. After formation of the p-type buffer region 210, the second mirror region 208, the active region 204, and the first mirror region 206 are formed according to techniques well known in the art. In FIG. 2A, the second mirror region 208 is comprised of alternating p-type layers having different indices of refraction. The thickness of each layer is chosen to be one quarter of the lasing wavelength. Assuming a lasing wavelength of 980 nm each of the alternating layers in the mirror region would have a thickness of 9800 Å/n where n is the refractive index of the layer.

After formation of the second mirror region 208, the active region 204 is formed. The thickness of active region 204 should be the lasing wavelength or a multiple of the lasing wavelength. Typically the active region 204 is comprised of an light generation region 209 positioned between first and second confinement or cladding regions 211a, 211b. In FIG. 2A, the first cladding layer 211a is p-doped AlGaAs having a preferred dopant concentration of $5 \times 10^{17}$ atoms/$cm^3$ and a thickness of approximately 1000 Å. The light generation region 209 is comprised of alternating GaAs barrier layers and $In_{0.2}Ga_{0.8}As$ layers (not shown) forming quantum well structures. After formation of the light generation region, a second cladding region 211b is formed. The second cladding region is typically n-doped AlGaAs having a n-type dopant concentration of $5 \times 10^{17}$ atoms/$cm^3$ and a thickness of approximately 1000 Å.

After formation of the active region 204, the first mirror region 206 is formed. The first mirror region 206 is comprised of alternating n-type layers having different indices of refraction and a thickness equal to one quarter of the lasing wavelength. In the preferred embodiment, there are 15 pairs of alternating layers. For purposes of example, the alternating layers are AlAs doped with silicon having a dopant concentration of $1 \times 10^{18}$ atoms/$cm^3$ and GaAs doped with silicon having a dopant concentration $1 \times 10^{18}$ atoms/$cm^3$. Regions 230 of the first mirror region 206 may be converted to regions of high resistivity by an implant step. Typically, this is accomplished by implanting with hydrogen atoms.

After formation of the n-type mirror region 206, contact to the SEL are made. Referring to FIG. 2A shows a bottom emitting SEL including a tunnel junction 216 formed between the n-type substrate 202 and the p-type buffer region 210. Thus, in the device structure shown in FIG. 2A n-contacts 214 are made to the bottom surface of the n+ substrate 202. N-contact 212 is made to the top surface of the n-type mirror region 206. FIG. 2B shows a top emitting SEL. The top emitting SEL is similar to the bottom emitting laser shown in FIG. 2A, however, the bottom emitting SEL typically includes a phase matching layer 236 not found in the top emitting SEL.

FIG. 3 shows a cross-sectional view of the n-drive SEL fabricated on a n-type substrate according to an alternative embodiment of the present invention. Similar to the first embodiment shown in FIG. 2, the alternative embodiment includes a light generation region 304, first and second mirror regions 306, 308 located on opposite sides of the light generation region 304 where the second mirror region 306 has a first side and a second side, a buffer region 310 being located on the second side of the second mirror region 306, and a substrate 302. Although the embodiments shown in FIG. 3 include a buffer region 310, in the alternative embodiment a tunnel junction is not formed between the buffer region 310 and the substrate 302.

Figure 3A:
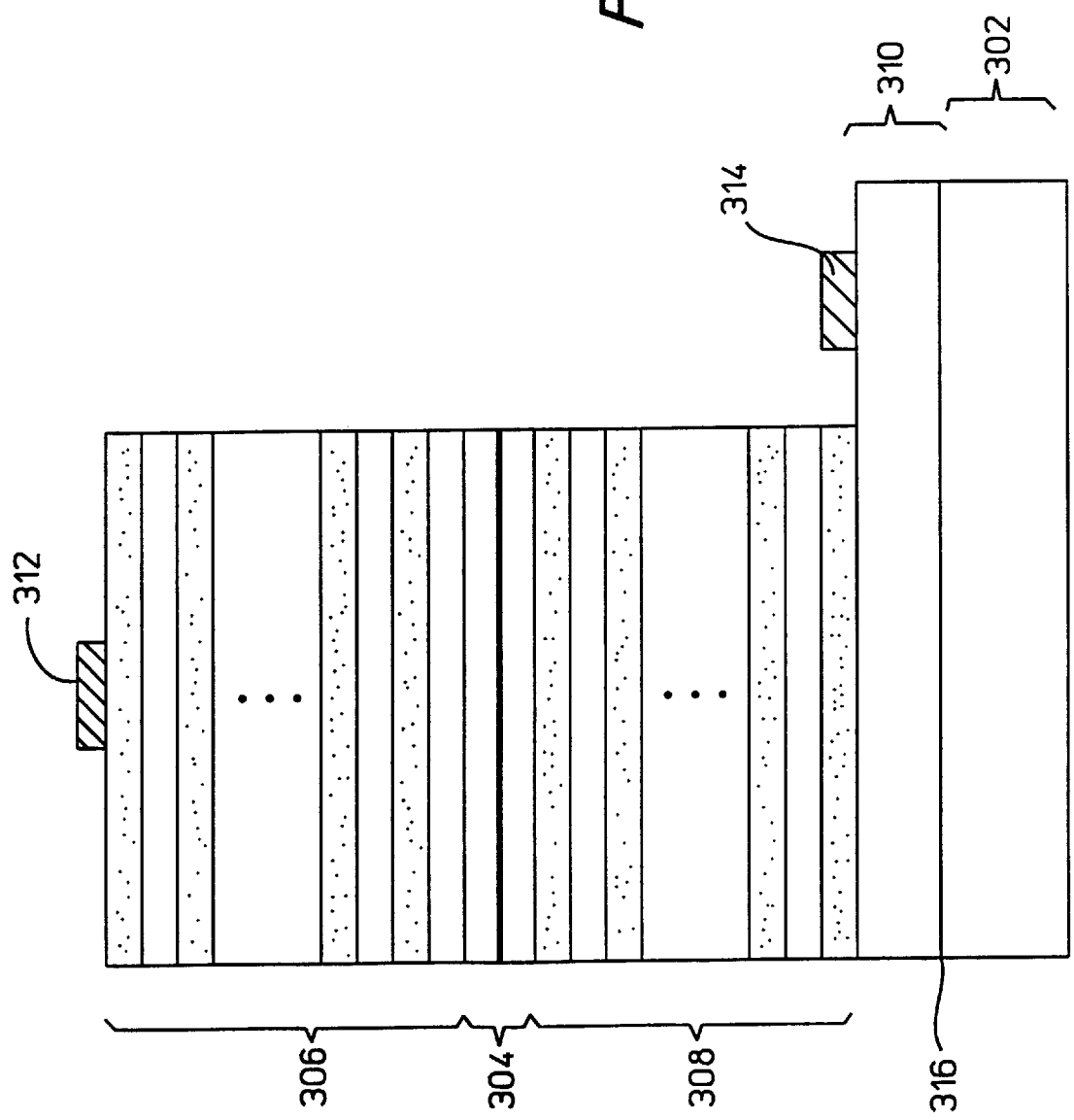
FIGS. 3A and 3B show a cross-sectional view of the n-drive SEL fabricated on a n-type substrate according to an alternative embodiment of the present invention.
Figure 3B:
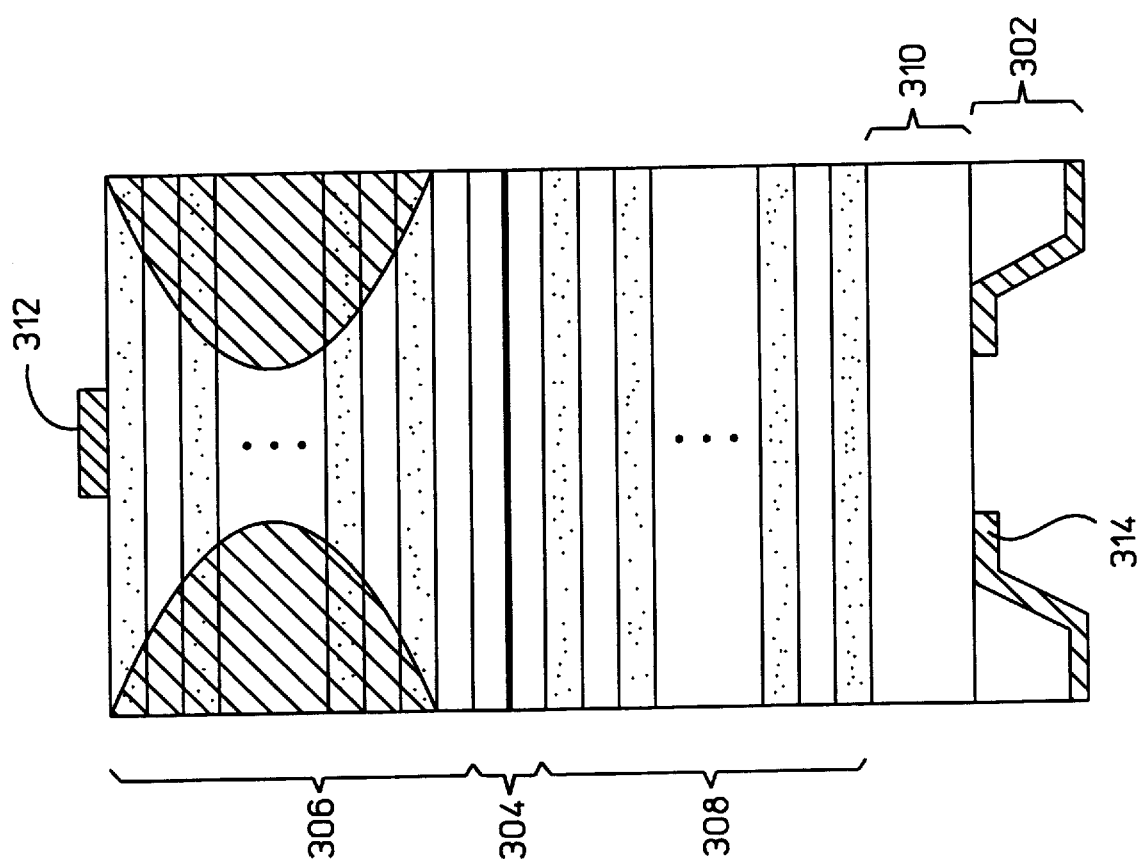

FIG. 3A shows a top emitting SEL according to the alternative embodiment. FIG. 3B shows a bottom emitting SEL according to an alternative embodiment of the present invention. In the embodiment shown in FIG. 3A, p-contact is not made using a tunnel contact but instead is made using a via to the buffer region 310. P-contact 314 is made by etching through the n-type mirror region 306, the active region 304, and the p-type mirror region 304 to the surface of the p-type buffer region 310 and forming a metal contact 312. Alternatively, as shown in FIG. 3B, p-contact 314 can be made by performing a bottom etch through the n+ substrate layer 302 to the p-type buffer region 310.

In the embodiments 3A and 3B, a junction 316 is formed between the substrate 302 and the buffer region 310. However, unlike the embodiment shown in FIG. 2A and 2B, in the embodiment shown in FIG. 3A and 3B a tunnel contact is not formed. Thus the dopant concentration differential at the junction 316 is not critical. Further, in the alternative preferred embodiment the substrate region 302 is comprised solely of an n-type GaAs substrate and the buffer region and the buffer region is comprised of a single p-type doped GaAs layer.

It is understood that the above description is intended to be illustrative and not restrictive. By way of example, the materials, dopant concentrations, and thickness of the various layers comprising the device may vary. Further, the number of layers comprising the substrate, buffer and mirror regions may vary. The scope of the invention should therefore not be determined with reference to the above description, but instead should be determined with reference to the appended claims, along with the full scope of the equivalents to which such claims are entitled.

What is claimed is:

1. A light emitting device comprising:
   an active region including a light generation region for generating light in response to light passing therethrough, the active region having a first side and a second opposite side;
   a first mirror region having a first conductivity type, the first mirror region for reflecting light towards the light generation region, the first mirror region being located on the first side of the active region;
   a second mirror region having a second conductivity type and a first and second opposite side, the second mirror region for reflecting light towards the light generation region, the first side of the second mirror region being located on second side of the active region;
   a buffer region having a first side and a second opposite side, the first side of the buffer region being located on the second side of the second mirror region, the buffer region layer having a second conductivity type; and
   a substrate region having a first and second side, the first side of the substrate region being located on the second side of the buffer region, the substrate region having a first conductivity type,
   wherein the buffer region and the substrate region forms a tunnel contact.

2. The device recited in claim 1 wherein the tunnel contact is reverse biased.

3. The device recited in claim 1 wherein the dopant concentration of the portion of the buffer region contacting the substrate region is degeneratively doped and the portion of the substrate region contacting the buffer region is degeneratively doped.

4. The device recited in claim 3 wherein the dopant concentration of the buffer region contacting the substrate region is in the range of $1 \times 10^{19}$ to $1 \times 10^{21}$ atoms/$cm^3$ and the dopant concentration of the portion of the substrate region contacting the buffer region is in the range of $5\times10^{17}$ to $5\times10^{19}$ atoms/cm$^3$.

5. The device recited in claim 1 further including a n contact made to the first mirror region and a n contact made to the n-type substrate region, wherein a tunnel contact provides contact to the second mirror region.

6. A process of forming a light emitting device comprising the steps of:

forming an active region including a light generation region for generating light in response to light passing therethrough, the active region having a first side and a second opposite side;

forming a first mirror region having a first conductivity type, the first mirror region for reflecting light towards the light generation region, the first mirror region being located on the first side of the active region;

forming a second mirror region having a second conductivity type and a first and second opposite side, the second mirror region for reflecting light towards the light generation region, the first side of the second mirror region being located on second side of the active region;

forming a buffer region having a first side and a second opposite side, the first side of the buffer region being located on the second side of the second mirror region, the buffer region layer having a second conductivity type; and forming a substrate region having a first and second side, the first side of the substrate region being located on the second side of the buffer region, the substrate region having a first conductivity type, wherein a tunnel contact is formed by degeneratively doping the portion of the buffer region contacting the substrate region and degeneratively doping the portion of the substrate region contacting the buffer region.

7. The process recited in claim 6 wherein the dopant concentration of the buffer region contacting the substrate region is in the range of $1\times10^{19}$ to $1\times10^{21}$ atoms/cm$^3$ and the dopant concentration of the portion of the substrate region contacting the buffer region is in the range of $5\times10^{17}$ to $5\times10^{19}$ atoms/cm$^3$.

8. The process recited in claim 6 wherein the tunnel contact is reverse biased.

9. The process recited in claim 6 further including the step of forming a n contact to the first mirror region and a n contact to the n-type substrate region, wherein a tunnel contact provides a contact to the second mirror region.

10. A light emitting device comprising:

an active region including a light generation region for generating light in response to light passing therethrough, the active region having a first side and a second opposite side;

a mirror region having a second conductivity type and a first and second opposite side, the mirror region for reflecting light towards the light generation region, the first side of the mirror region being located on second side of the active region;

a buffer region having a first side and a second opposite side, the first side of the buffer region being located on the second side of the mirror region, the buffer region layer having a second conductivity type; and a substrate region having a first and second side, the first side of the substrate region being located on the second side of the buffer region, the substrate region having a first conductivity type, wherein the buffer region and substrate region forms a tunnel contact.

11. The light emitting device recited in claim 10 wherein the tunnel contact is reverse biased.

12. The light emitting device recited in claim 10 wherein the dopant concentration of the portion of the buffer region contacting the substrate region is degeneratively doped and the portion of the substrate region contacting the buffer region is degeneratively doped.

13. The light emitting device recited in claim 12 wherein the dopant concentration of the buffer region contacting the substrate region is in the range of $1\times10^{19}$ to $1\times10^{21}$ atoms/cm$^3$ and the dopant concentration in the $5\times10^{17}$ to $5\times10^{19}$ atoms/cm$^3$.

14. A process of forming a light emitting device comprising the steps of:

forming an active region including a light generation region for generating light in response to light passing therethrough, the active region having a first side and a second opposite side;

forming a mirror region having a second conductivity type and a first and second opposite side, the second mirror region for reflecting light towards the light generation region, the first side of the mirror region being located on second side of the active region;

forming a buffer region having a first side and a second opposite side, the first side of the buffer region being located on the second side of the mirror region, the buffer region layer having a second conductivity type; and forming a substrate region having a first and second side, the first side of the substrate region being located on the second side of the buffer region, the substrate region having a first conductivity type, wherein a tunnel contact is formed by degeneratively doping the portion of the buffer region contacting the substrate region and degeneratively doping the portion of the substrate region contacting the buffer region.

15. The light emitting device recited in claim 14 further including the step of reverse biasing the tunnel contact.

16. The light emitting device recited in claim 14 wherein the dopant concentration of the buffer region contacting the substrate region is in the range of $1\times10^{19}$ to $1\times10^{21}$ atoms/cm$^3$ and the dopant concentration in the $5\times10^{17}$ to $5\times10^{19}$ atoms/cm$^3$.

* * * * *